United States Patent
Mathur et al.

(10) Patent No.: US 11,670,363 B2
(45) Date of Patent: Jun. 6, 2023

(54) MULTI-TIER MEMORY ARCHITECTURE

(71) Applicant: Arm Limited, Cambridge (GB)

(72) Inventors: Rahul Mathur, Austin, TX (US);
Mudit Bhargava, Austin, TX (US);
Andy Wangkun Chen, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 17/238,683

(22) Filed: Apr. 23, 2021

(65) Prior Publication Data
US 2022/0343970 A1  Oct. 27, 2022

(51) Int. Cl.
*G11C 5/06* (2006.01)
*G11C 11/4093* (2006.01)
*G11C 11/4094* (2006.01)
*G11C 11/408* (2006.01)

(52) U.S. Cl.
CPC ............ *G11C 11/4093* (2013.01); *G11C 5/06* (2013.01); *G11C 11/4085* (2013.01); *G11C 11/4094* (2013.01)

(58) Field of Classification Search
CPC ................................................ G11C 11/4093
See application file for complete search history.

(56) References Cited

U.S. PATENT DOCUMENTS

| | | | | |
|---|---|---|---|---|
| 11,087,832 | B1* | 8/2021 | Gomes | G11C 11/412 |
| 2020/0135718 | A1* | 4/2020 | Liebmann | H01L 27/0688 |
| 2021/0143065 | A1* | 5/2021 | Gardner | H01L 21/8221 |
| 2021/0202499 | A1* | 7/2021 | Gardner | H01L 21/823871 |

OTHER PUBLICATIONS

Srinivasa, et al.; A Monolithic-3D SRAM Design with Enhanced Robustness and In-Memory Computation Support; ISLPED '18: Proceedings of the International Symposium on Low Power Electronics and Design; Article No. 34, pp. 1-6; Jul. 2018. https://doi.org/10.1145/3218603.3218645.

Puttaswamy, et al.; 3D-Integrated SRAM Components for High-Performance Microprocessors; IEEE Transactions On Computers; vol. 58, No. 10; Oct. 2009.

* cited by examiner

*Primary Examiner* — Min Huang
(74) *Attorney, Agent, or Firm* — Pramudji Law Group PLLC; Ari Pramudji

(57) ABSTRACT

Various implementations described herein are directed to a device having a multi-tiered memory structure with a first tier and a second tier arranged vertically in a stacked configuration. The device may have multiple transistors disposed in the multi-tiered memory structure with first transistors disposed in the first tier and second transistors disposed in the second tier. The device may have a single interconnect that vertically couples the first transistors in the first tier to the second transistors in the second tier.

20 Claims, 8 Drawing Sheets

700

710 — split memory circuitry into a multi-tiered memory structure with a first tier, a second tier and a third tier arranged vertically in a stacked configuration

720 — dispose multiple transistors in the multi-tiered memory structure with first transistors configured as read ports in the first tier, second transistors configured as a storage cell in the second tier, and third transistors configured as write ports in the third tier

730 — vertically couple the first transistors in the first tier to the second transistors in the second tier with a first single interconnect

740 — vertically couple the third transistors in the third tier to the second transistors in the second tier with a second single interconnect

MULTI-TIER MEMORY ARCHITECTURE

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some conventional memory designs, a multi-port register file may have multiple wordlines with access transistors that pass signals to different sets of bitlines when enabling multiple read/write operations in the same cycle. The area of such a memory bitcell may be dominated by metal routings needed for the multiple wordlines and bitlines that may not scale well with a larger number of read/write ports. One architectural technique used for this issue refers to having multiple single-port memories to store the exact same cache copies so that multiple loads/stores typically occur in parallel. However, a disadvantage of this architectural technique is that the area and power overhead of multiple memories increases with additional logic components. With data bandwidth requirements increasing from modern applications, simultaneous read/write access requests to a memory also increases. As such, there exists a need to implement multi-porting features in an area efficient manner that are able to scale well with the number of read/write ports in some modern circuit designs.

BRIEF DESCRIPTION OF THE DRAWINGS

Implementations of various memory layout schemes and techniques are described herein with reference to the accompanying drawings. It should be understood, however, that the accompanying drawings illustrate only various implementations described herein and are not meant to limit embodiments of various techniques described herein.

FIGS. 6-7 illustrate diagrams of methods for providing 3D multi-ported memory architecture in accordance with various implementations described herein.

DETAILED DESCRIPTION

Various implementations described herein are directed to 3D multi-ported memory architecture schemes and techniques for memory applications in reference to physical layout designs of various multi-tier configurations. For instance, the various physical layout design schemes and techniques described herein may provide for enhanced multi-ported 3D static random access memory (SRAM) architecture.

Various advantages and benefits may be achieved with implementing the 3D multi-ported memory architecture schemes and techniques as described herein. The cell designs described herein provide for cell area footprint reduction due to easing of routing congestion, wherein substantial cell area improvement provides for smaller wordline length and improved memory timing. Some highly resistive wires, such as, e.g., read wordlines, may be potentially made wider, which may lead to further improvements in timing. Also, various schemes and techniques described herein may provide for efficient splitting of peripheral circuitry between multiple tiers, such as, e.g., two tiers, three tiers, etc. Also, in some instances, there may be little to no degradation of cell static noise margins (SNM), writability and/or drive performance when compared to regular two-dimensional (2D) eight-transistor (8T) SRAM cells. Moreover, the 3D multi-ported memory architecture scales well for additional read ports, and more read ports may be stacked on additional upper tiers that extend in the same 3D connection. Also, this 3D feature is generally beneficial because the fabrication requirements of read ports is typically much higher than that for write ports.

Various implementations of providing various 3D multi-ported memory architecture will be described herein with reference to FIGS. 1-7.

Figure 1A:
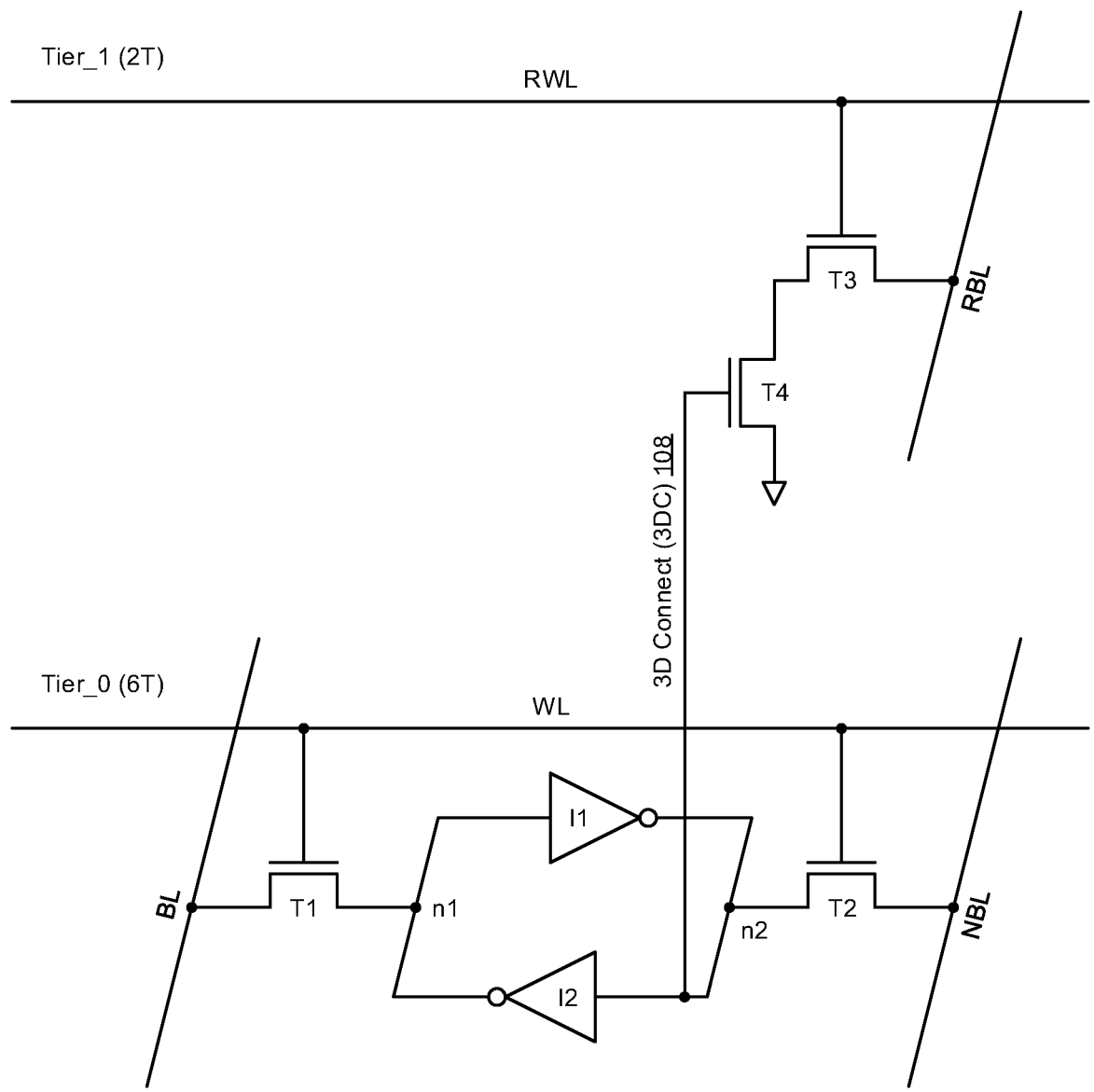
FIGS. 1A-1B illustrate various diagrams of multi-ported memory architecture in multi-tier configurations in accordance with implementations described herein.
Figure 1B:
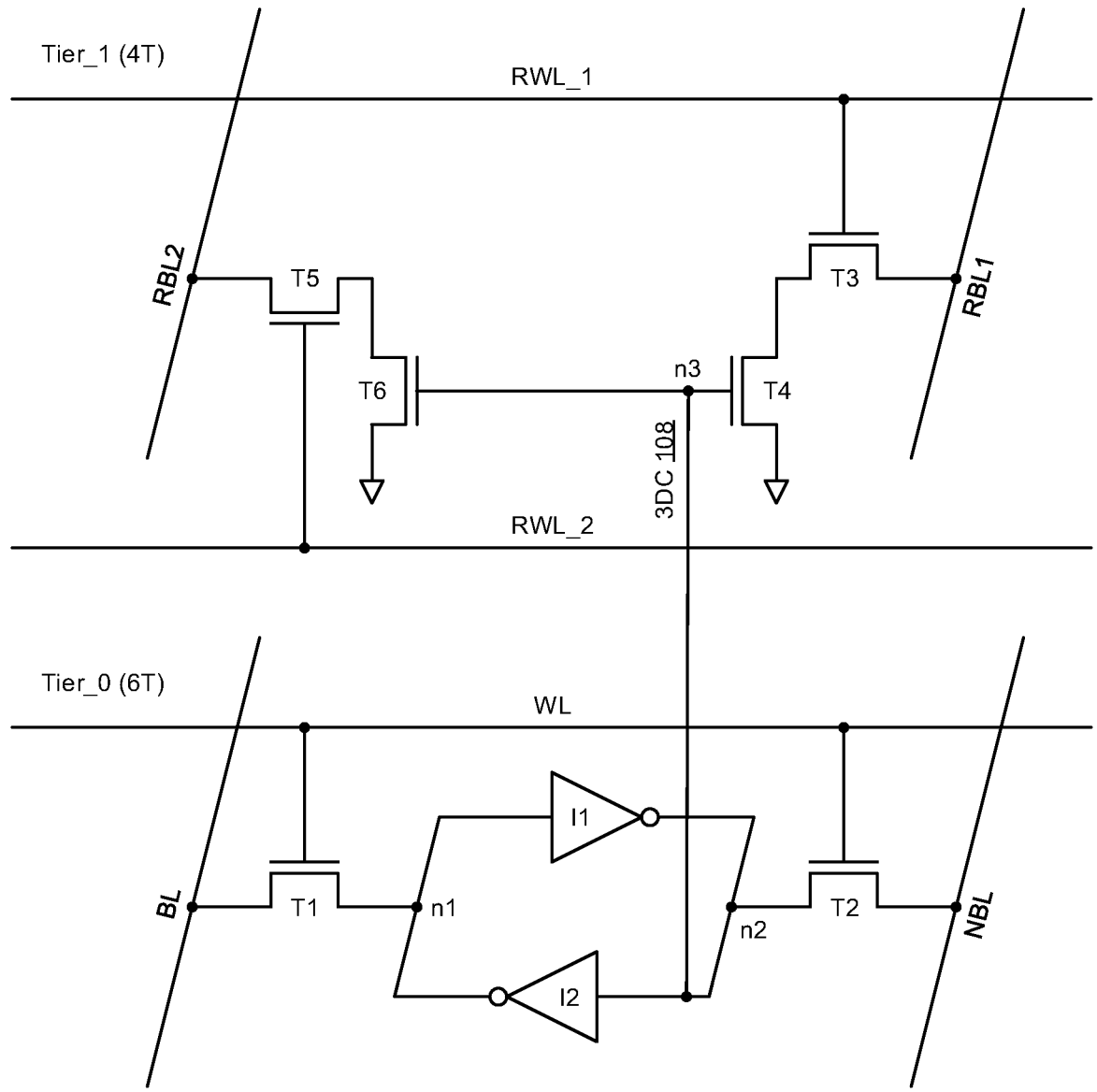

FIGS. 1A-1B illustrate various diagrams of multi-ported memory architecture in multi-tier configurations in accordance with implementations described herein. In particular, FIG. 1A shows a schematic diagram 100A of 3D multi-ported memory architecture 104A in multi-tier configuration, and FIG. 1B shows a schematic diagram 100B of 3D multi-ported memory architecture 104B in multi-tier configuration.

In various implementations, the 3D memory architecture may be implemented as a system or a device having various integrated circuit (IC) components that are arranged and coupled together as an assemblage or a combination of parts that provide for physical circuit designs and various related structures. In some instances, a method of designing, providing, fabricating and/or manufacturing 3D memory architecture as an integrated system or device may involve use of the various IC circuit components described herein so as to implement various related fabrication schemes and techniques associated therewith. Moreover, the 3D memory architecture may be integrated with computing circuitry and related components on a single chip, and the 3D memory architecture may be implemented and/or incorporated in various embedded systems for automotive, electronic, mobile, server and Internet-of-things (IoT) applications, including remote sensor nodes.

As shown in FIG. 1A, the 3D multi-ported memory architecture 104A refers to three-dimensional (3D) stacked memory structure in a multi-tier configuration. For instance, the memory architecture 104A may include multiple tiers including a first tier (Tier_0) and a second tier (Tier_1) that are arranged in a 3D stacked structure. In some implementations, the first tier (Tier_0) may have first circuitry with multiple logic components, and the second tier (Tier_1) may include second circuitry with multiple logic components. The first circuitry in the first tier (Tier_0) may include multiple transistors that are arranged and configured as a six-transistor (6T) bitcell having to access transistors (T1, T2) and a cross-coupled inverter structure (I1, I2) that include four transistors. The second circuitry in the second tier (Tier_1) may include multiple transistors that are arranged and configured to provide a two-transistor (2T) read port with two transistors (T3, T4). Also, the memory architecture 104A may include a single 3D connection (3DC) 108 that is configured to provide a single inter-tier connection between the multiple tiers (Tier_0, Tier_1) for coupling transistor (T2) at node (n2) in the first tier (Tier_0) to a gate of transistor (T4) in the second tier (Tier_1).

In various implementations, the combination of the first tier (Tier_0) and the second tier (Tier_1) may provide an eight-transistor (8T) bitcell that may be referred to as a 3D 8T 2-port static random access memory (SRAM) bitcell having 1-write port and 1-read-write port (1R1RW). As shown in FIG. 1A, the first tier (Tier_0) has a wordline (WL) coupled to gates of the access transistors (T1, T2), and the first tier (Tier_0) also has bitlines (BL, NBL) coupled to the access transistors (T1, T2), wherein transistor (T1) is coupled between bitline (BL) and node (n1), and wherein transistor (T2) is coupled between bitline (NBL) and node (n2). Also, as shown in FIG. 1A, the second tier (Tier_1) has a read wordline (RWL) coupled to a gate of read transistor (T3), and also, read transistors (T3, T4) may be coupled in series between a read bitline (RBL) and ground. In some instances, transistors (T1, T2, T3, T4) may refer to NMOS transistors, and each of the cross-coupled inverters (I1, I2) may include a PMOS transistor and an NMOS transistor; however, various other configurations may be used so as to provide similar features, characteristics and/or relevant behaviors.

In various implementations, in reference to FIG. 1A, the 3D multi-ported memory architecture 104A may include a multi-tiered memory structure with the first tier (Tier_0) and the second tier (Tier_1) arranged vertically in a stacked configuration. The 3D multi-ported memory architecture 104A may include multiple transistors (T1, T2, T3, T4, I1, I2) disposed in the multi-tiered memory structure with first transistors (T1, T2, I1, I2) disposed in the first tier (Tier_0) and second transistors (T3, T4) disposed in the second tier (Tier_1). Also, the 3D multi-ported memory architecture 104A may include a single interconnect (3DC) 108 that vertically couples one or more of the first transistors (T1, T2, I1, I2) in the first tier (Tier_0) to the second transistors (T3, T4) in the second tier (Tier_1). In some instances, the 3D multi-ported memory architecture 104A may refer to SRAM device that is arranged in a 3D stacked configuration. Further, as shown in FIG. 1A, the single interconnect (3DC) 108 may extend between the first tier (Tier_0) and the second tier (Tier_1), wherein the first tier (Tier_0) refers to a read-write (RW) tier and the second tier (Tier_1) refers to a read tier (R), and wherein the single interconnect (3DC) 108 may be configured to vertically couple one or more of the first transistors (T1, T2, I1, I2) disposed in the read-write (RW) tier to a gate of at least one of the second transistors (T3, T4) disposed in the read (R) tier.

In some implementations, the 3D multi-ported memory architecture 104A may refer to a the multi-tiered memory structure such as, e.g., a multi-tiered bitcell structure, and also, the first transistors (T1, T2, I1, I2) and the second transistors (T3, T4) may be arranged and configured as a bitcell having the multi-tiered bitcell structure. Also, the first tier (Tier_0) may refer to a read-write (RW) tier having wordlines (WL) and bitlines (BL, NBL), wherein the first transistors (T1, T2, I1, I2) are arranged in a lower portion of the bitcell, and wherein the first transistors (T1, T2, I1, I2) are coupled to the wordlines (WL) and the bitlines (BL, NBL) for reading and writing data to the bitcell. Also, the second tier (Tier_1) may refer to a read (R) tier having a read wordline (RWL) and a read bitline (RBL), wherein the second transistors (T3, T4) are arranged in an upper portion of the bitcell, and wherein the second transistors (T3, T4) are coupled to the read wordline (RWL) and the read bitline (RBL) for reading data from the bitcell. Moreover, the bitcell refers to an eight-transistor (8T) bitcell having one read port (1R) and one read-write port (1RW). Also, the first transistors (T1, T2, I1, I2) may refer to six transistors (6T) in the read-write (RW) tier of the 8T bitcell. Also, the second transistors (T3, T4) may refer to two transistors (2T) in the read (R) tier of the 8T bitcell.

As shown in FIG. 1B, the 3D multi-ported memory architecture 104B refers to a 3D stacked memory structure in a multi-tier configuration that is similar in scope and features to the 3D multi-ported memory architecture 104A in FIG. 1A, wherein similar components have similar features, characteristics and related behaviors. For instance, as shown in FIG. 1B, the memory architecture 104B may have multiple tiers including the first tier (Tier_0) and the second tier (Tier_1) arranged in a 3D stacked structure. The first tier (Tier_0) may include the first transistors (T1, T2, I1, I2) arranged as a 6T bitcell, and the second tier (Tier_1) may include the second transistors (T3, T4) along with two additional transistors (T5, T6). In some instances, the second tier (Tier_1) may thus include four transistors (4T), wherein the second transistors (T3, T4, T5, T6) are arranged between multiple read wordlines (RWL_1, RWL_2) and multiple read bitlines (RBL1, RBL2). As shown in FIG. 1B, a first read wordline (RWL1) is coupled to a gate of read transistor (T3), and read transistors (T3, T4) are coupled in series between a first read bitline (RBL1) and ground. Also, a second read wordline (RWL2) may be coupled to a gate of read transistor (T5), and read transistors (T5, T6) may be coupled in series between a second read bitline (RBL2) and ground.

Moreover, in various implementations, as shown in FIG. 1B, the 3D multi-ported memory architecture 104B may include the single interconnect (3DC) 108 that is configured to vertically couple one or more of the first transistors (T1, T2, I1, I2) in the first tier (Tier_0) to one or more of the second transistors (T3, T4, T5, T6) in the second tier (Tier_1). In some instances, the single interconnect (3DC) 108 may be configured to couple transistor (T2) in the first tier (Tier_0) at node (n2) to gates of transistors (T4, T6) in the second tier (Tier_1) at node (n3). In various instances, transistors (T1, T2, T3, T4) may refer to NMOS transistors, and each of the cross-coupled inverters (I1, I2) may include a PMOS transistor and an NMOS transistor, and second transistors (T3, T4, T5, T6) may refer to NMOS transistors; however, various other transistor configurations may be used so as to thereby provide similar features, characteristics and/or relevant behaviors.

Further, in reference to FIG. 1B, the single interconnect (3DC) 108 may extend between the first tier (Tier_0) and the second tier (Tier_1), wherein the first tier (Tier_0) refers to a read-write (RW) tier and the second tier (Tier_1) refers to a read tier (R), and wherein the single interconnect (3DC) 108 may be configured to vertically couple one or more of the first transistors (T1, T2, I1, I2) disposed in the read-write (RW) tier to a gate of at least one of the second transistors (T3, T4) disposed in the read (R) tier.

In some implementations, the bitcell in FIG. 1B may refer to a ten-transistor (10T) bitcell having three read ports (3R) and one write port (1W), wherein the first transistors (T1, T2, T3, T4) refer to six transistors (6T) in the read-write (RW) tier of the 10T bitcell. Also, the second transistors (T3, T4, T5, T6) may refer to four transistors (4T) that are arranged and disposed in the read (R) tier of the 10T bitcell.

In some implementations, FIG. 1A provides for a transistor-level implementation of a multi-port cell with the write port on Tier_0 and the read port on Tier_1. In this instance, peripheral logic in memory I/O for the write port (e.g., write drivers and input data latch) may be disposed in a lower tier (e.g., Tier_0) so as to interface directly with the bitlines (BL/NBL). Also, peripheral logic in the memory I/O for the read port (e.g., read latch and keeper circuitry) may be disposed in an upper tier (e.g., Tier_1) so as to directly interface with the read bitline (RBL). Moreover, FIG. 1B provides for a transistor-level implementation of a multi-port cell with the write port on Tier_0 and multiple read ports on Tier_1.

Figure 2:
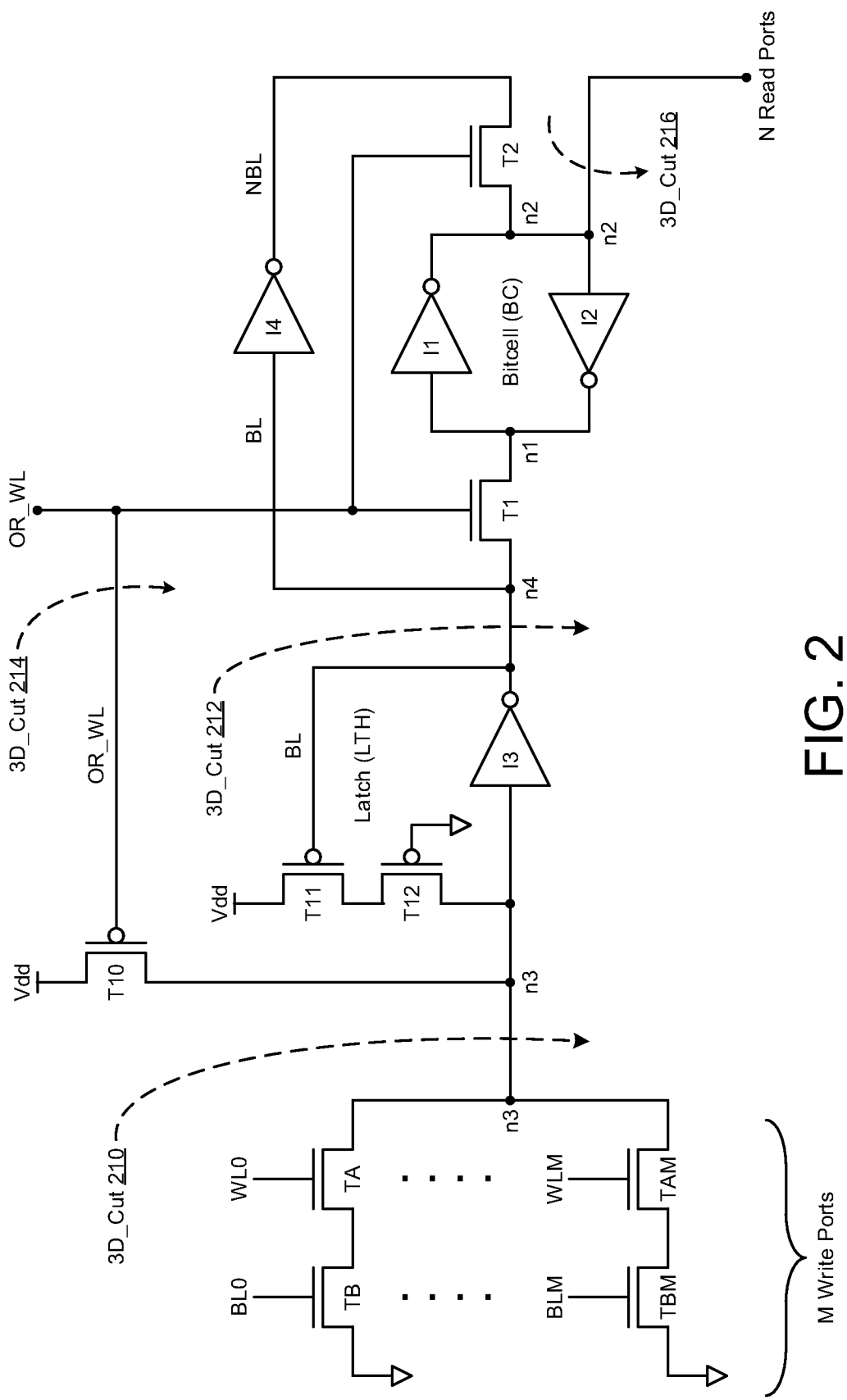
FIG. 2 illustrates a diagram of multi-ported memory architecture with possible 3D cut information in accordance with implementations described herein.

FIG. 2 illustrates a diagram 200 of 3D multi-ported memory architecture 204 with possible 3D cut information in accordance with implementations described herein. In some implementations, various components in the 3D multi-ported memory architecture 204 shown in FIG. 2 may be similar to various components and circuit in the 3D multi-ported memory architecture 104A, 104B shown in FIGS. 1A-1B.

As shown in FIG. 2, the 3D multi-ported memory architecture 204 may include a bitcell (BC) with access transistors (T1, T2) and cross-coupled inverters (I1, I2) having a read port coupled at node (n2). The 3D multi-ported memory architecture 204 may have a number (M) of write ports coupled a node (n3), and a number (M) of wordlines (WL0, . . . , WLM) are coupled to gates of transistors (TA0, . . . , TAM), and a number (M) of bitlines (BL0, . . . , BLM) are coupled to gates of transistors (TB0, . . . , TBM). The 3D multi-ported memory architecture 204 may have an optional latch (LTH) having various logic configured to keep a value to be written, e.g., as a local write driver. In some instances, node (n3) may be coupled to an input of inverter (I3) and an output of inverter (I3) may be coupled to transistor (T1) at node (n4), and node (n4) may be coupled to an input of inverter (I4) and an output of inverter (I4) may be coupled to transistor (T2). Also, transistor (T10) may be coupled between node (n3) and a source voltage (Vdd), and a gate of transistor (T10) may be coupled to a control signal (OR_WL), which is also coupled to gates of transistors (T1, T2). Also, transistors (T11, T12) may be coupled in series between source voltage (Vdd) and node (n3), wherein a gate of transistor (T11) is coupled to the output of inverter (I3) at node (n4), and wherein a gate of transistor (T12) coupled to ground. In some instances, transistors (TA0, . . . , TAM and TB0, . . . , TBM) may refer to NMOS transistors, and also, transistors (T10, T11, T12) may refer to PMOS transistors; however, various other transistor configurations may be used to provide similar scope, features, characteristics and/or related behaviors.

In some implementations, circuitry of the 3D multi-ported memory architecture 204 may be split with various 3D_cuts so as to provide a 3D multi-tiered structure. For instance, a 3D_Cut 210 may be provided near or adjacent to node (n3) so as to separate and/or divide the circuitry into separate tiers, such as, e.g., a first tier and a second tier. In other instances, another 3D_Cut 212 may be provided near or adjacent to node (n4) so as to separate and/or divide the circuitry into separate tiers, such as, e.g., a first tier and a second tier. In various other instances, another 3D_Cut 214 may be provided near or adjacent to the control signal line (OR_WL) so as to separate and/or divide the circuitry into separate tiers, such as, e.g., a first tier and a second tier. In some other instances, another 3D_Cut 216 may be provided near or adjacent to node (n2) so as to separate and/or divide the circuitry into separate tiers, such as, e.g., a first tier and a second tier. In various implementations, the various instances of 3D_Cuts (210, 212, 214, 216) for separation and division of the circuitry into multiple tiers are described in greater detail herein in reference to FIGS. 2-5.

Figure 3:
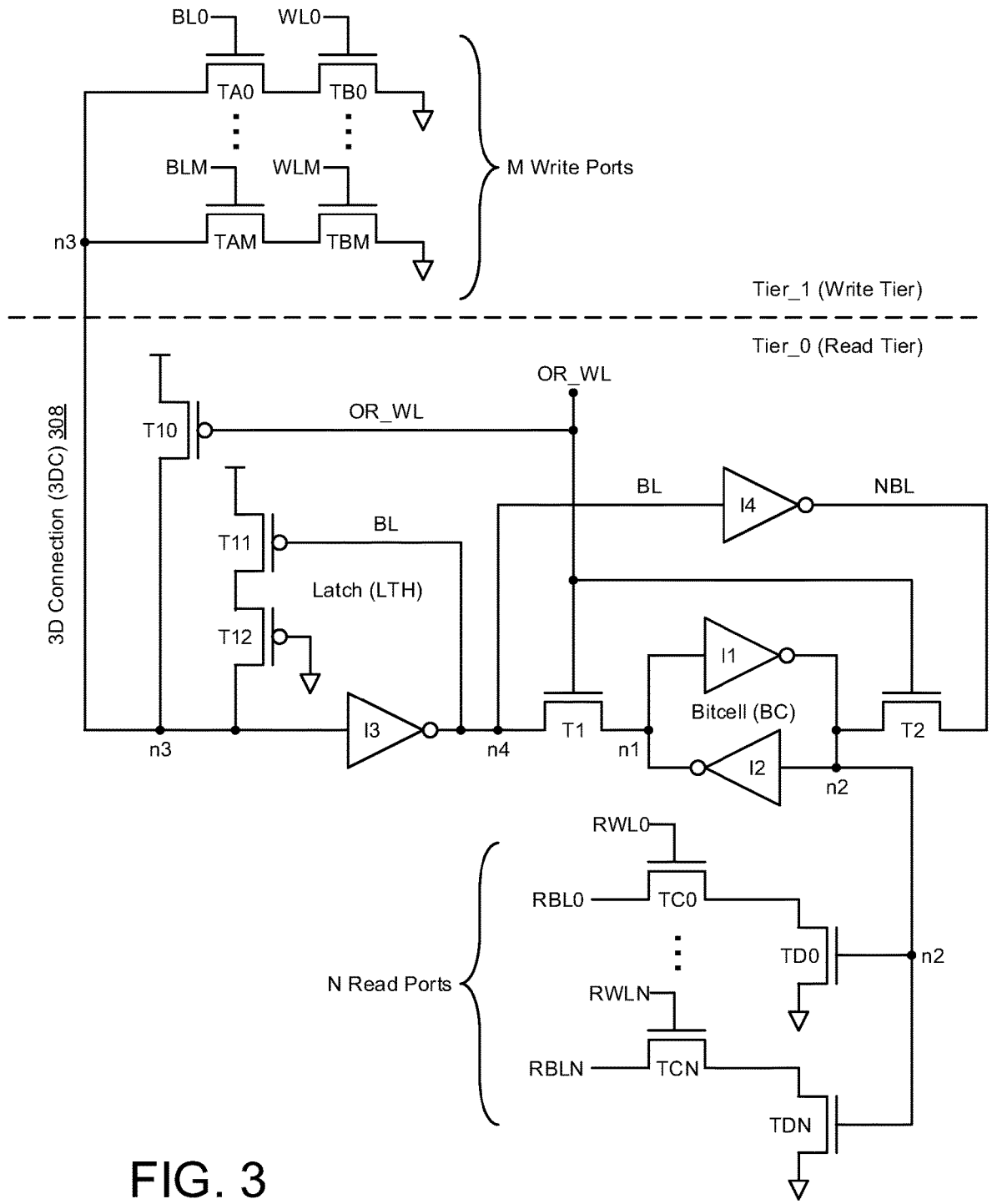
FIGS. 3-5 illustrate diagrams of 3D multi-ported memory architecture in various multi-tier configurations in accordance with implementations described herein.
Figure 4:
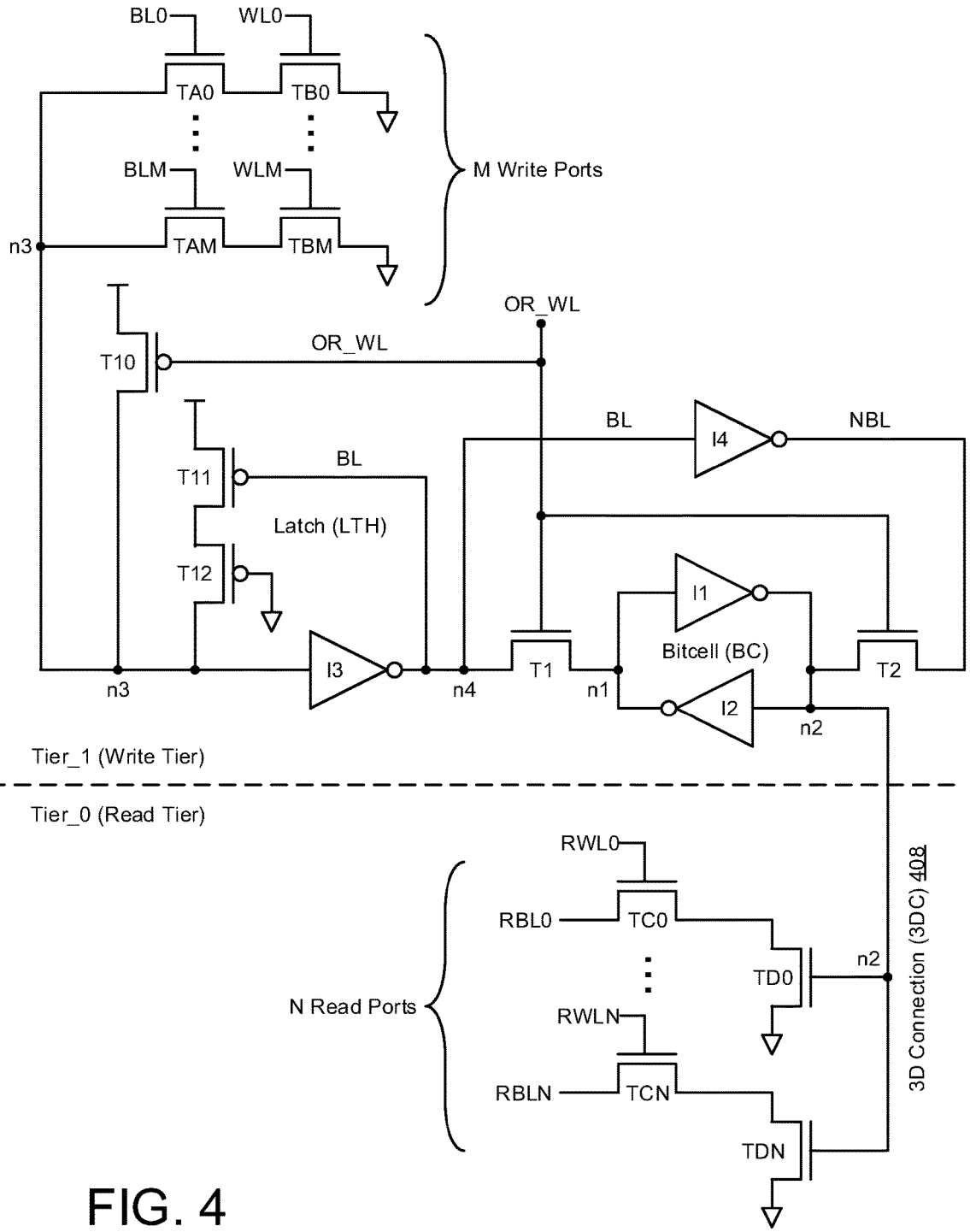
Figure 5:
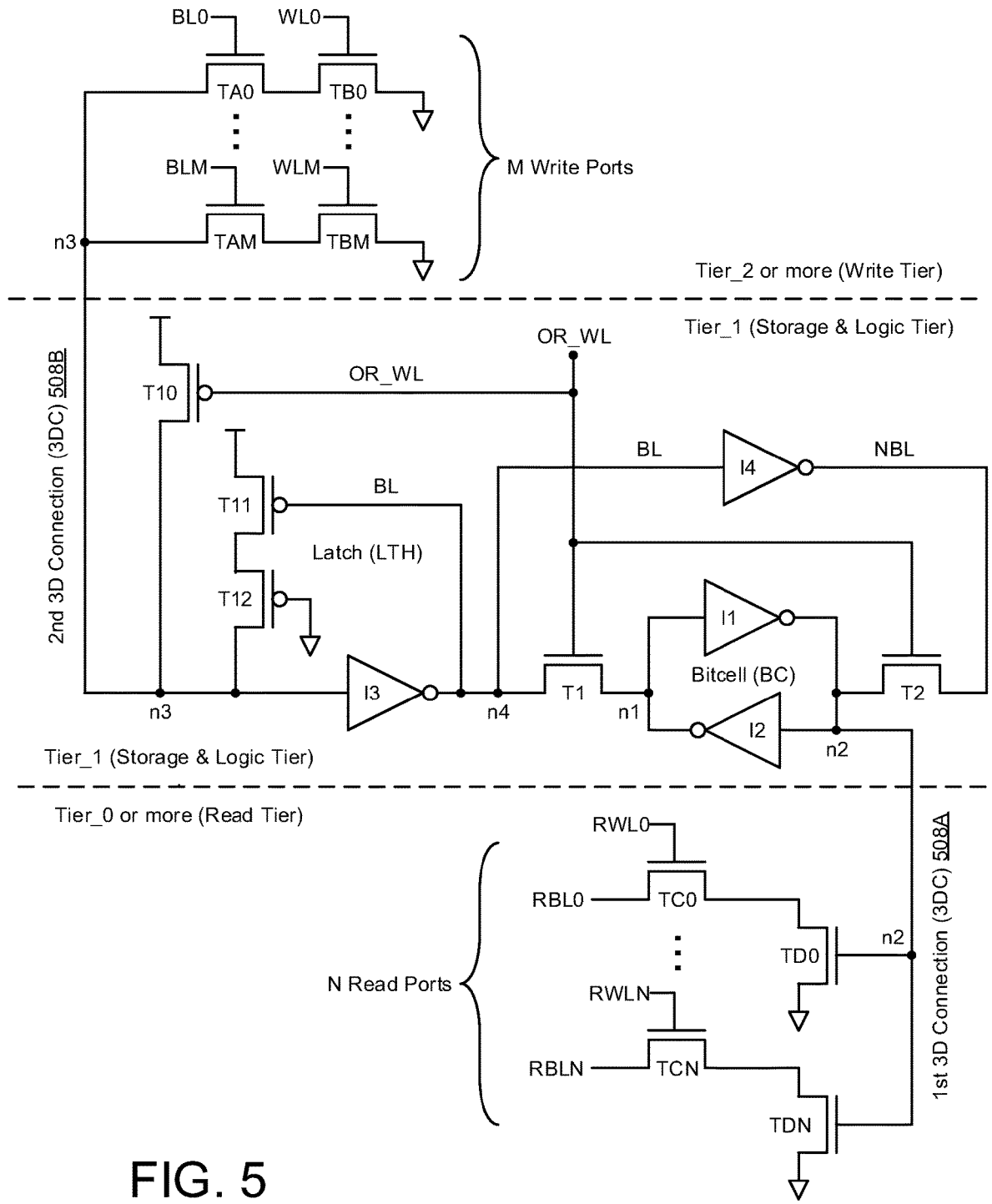

FIGS. 3-5 illustrate diagrams of 3D multi-ported memory architecture in various multi-tier configurations in accordance with implementations described herein. In particular, FIG. 3 shows a diagram 300 of 3D multi-ported memory architecture 304 in a first multi-tier configuration, FIG. 4 shows a diagram 400 of 3D multi-ported memory architecture 404 in a second multi-tier configuration, and also, FIG. 5 shows a diagram 500 of 3D multi-ported memory architecture 504 in a third multi-tier configuration.

As shown in FIG. 3, the 3D multi-ported memory architecture 304 has multiple tiers (Tier_0, Tier_1) configured in the first multi-tier configuration. In some implementations, a 3D_Cut may be provided at node (n3), wherein the number (M) of write ports along with wordlines (WL0, . . . , WLN) and the bitlines (BL0, . . . , BLM) may be disposed in the second tier (Tier_1). Also, the remaining circuitry including the optional latch (LTH), the bitcell (BC), and the number (N) of read ports along with transistors (TC0, . . . , TCN and TC0, . . . , TDN) are disposed in the first tier (Tier_0). In some instances, as shown in FIG. 3, corresponding transistors (TC0, . . . , TCN and TC0, . . . , TDN) are coupled in series between read bitlines (RBL0, . . . , RBLN) and ground, wherein gates of transistors (TC0, . . . , TCN) are coupled to read wordlines (RWL0, . . . , RWLN). Also, in some instances, the first tier (Tier_0) may refer to a read tier, and the second tier (Tier_1) may refer to a write tier.

In some implementations, the 3D multi-ported memory architecture 304 may refer to a multi-tier configuration, such as, e.g., a two-tier configuration, wherein the number (M) of write ports is greater than the number (N) of read ports. Moreover, as shown in FIG. 3, a single 3D connection (3DC) 308 may be used to vertically couple the cut node (n3) between the first tier (Tier_0) and the second tier (Tier_1).

As shown in FIG. 4, the 3D multi-ported memory architecture 404 has multiple tiers (Tier_0, Tier_1) configured in the second multi-tier configuration. In some instances, a 3D_Cut may be provided at node (n2), wherein the number (M) of write ports along with the wordlines (WL0, . . . , WLN) and the bitlines (BL0, . . . , BLM) may be disposed in the second tier (Tier_1). Also, the optional latch (LTH) and the bitcell (BC) may also be disposed in the second tier (Tier_1). The number (N) of read ports along with transistors (TC0, . . . , TCN and TC0, . . . , TDN) may be disposed in the first tier (Tier_0). Also, the first tier (Tier_0) may refer to a read tier, and the second tier (Tier_1) may refer to a write tier.

In some implementations, the 3D multi-ported memory architecture 404 may refer to a multi-tier configuration, such as, e.g., a two-tier configuration, wherein the number (M) of write ports is less than the number (N) of read ports. Moreover, as shown in FIG. 4, a single 3D connection (3DC) 408 may be used to vertically couple the cut node (n2) between the first tier (Tier_0) and the second tier (Tier_1).

As shown in FIG. 5, the 3D multi-ported memory architecture 504 has multiple tiers (Tier_0, Tier_1, Tier_2) configured in a third multi-tier configuration. In some instances, a 3D_Cut may be provided at nodes (n2, n3), wherein the number (M) of write ports along with the wordlines (WL0, . . . , WLN) and the bitlines (BL0, . . . , BLM) may be disposed in the third tier (Tier_2). Also, the optional latch (LTH) and the bitcell (BC) may be disposed in the second tier (Tier_1). Also, the number (N) of read ports along with transistors (TC0, . . . , TCN and TC0, . . . , TDN) may be disposed in the first tier (Tier_0). Also, the first tier (Tier_0) may refer to a read tier, the second tier (Tier_1) may refer to a storage and logic tier, and the third tier (Tier_2) may refer to a write tier.

In some implementations, the 3D multi-ported memory architecture 504 may refer to a multi-tier configuration, such as, e.g., a three-tier configuration, wherein the number (M) of write ports may be less than, equal to, or greater than the number (N) of read ports. Also, in other implementations, if more than two tiers are available, then the number of write ports (M) and the read ports (N) may be large. Moreover, as shown in FIG. 5, multiple 3D single connections (e.g., 508A, 508B) may be used to vertically couple multiple tiers (Tier_0, Tier_1, Tier_2) together. For instance, a first single 3D connection (3DC) 508A may be utilized to vertically couple the cut node (n2) between the first tier (Tier_0) and the second tier (Tier_1). Also, a second single 3D connection (3DC) 508B may be utilized to vertically couple the cut node (n3) between the second tier (Tier_1) and the third tier (Tier_2).

Figure 6:
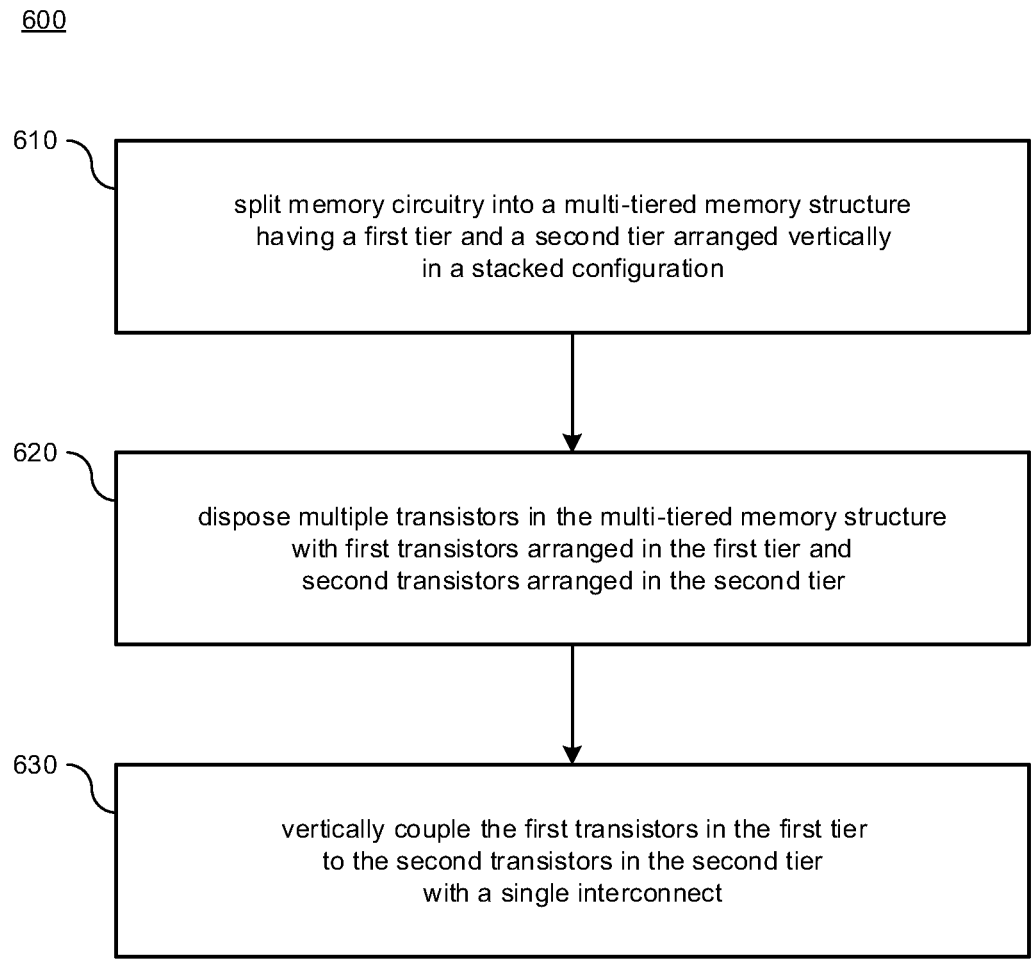

FIG. 6 illustrates a process flow diagram of a method 600 for providing 3D multi-ported memory architecture in accordance with implementations described herein. In some implementations, method 600 may refer to a method for splitting memory architecture into multiple tiers, such as, e.g., two tiers in a 3D multi-tiered memory structure.

It should be understood that even though method 600 indicates a particular order of operation execution, in some cases, various portions of operations may be executed in a different order, and on different systems. In other cases, additional operations and/or steps may be added to and/or omitted from method 600. Also, method 600 may be implemented in hardware and/or software. For instance, if implemented in hardware, method 600 may be implemented with various components and/or circuitry, as described in FIGS. 1-5. Also, in other instances, if implemented in software, method 600 may be implemented as a program or software instruction process configured for providing 3D multi-ported memory architecture, as described herein. Also, in other instances, if implemented in software, instructions related to implementing method 600 may be stored in memory and/or a database. Thus, in various implementations, a computer or various other types of computing devices with a processor and memory may be configured to perform method 600.

As described in reference to FIG. 6, the method 600 may be used for fabricating and/or manufacturing, or causing to be fabricated and/or manufactured, an integrated circuit (IC) that implements various layout schemes and techniques in physical design as described herein so as to provide 3D multi-ported and/or multi-tiered memory architecture using various associated devices, components and/or circuitry as described herein.

At block 610, method 600 may be configured to split memory circuitry into a multi-tiered memory structure having multiple tiers including, e.g., a first tier and a second tier, that are arranged vertically in a stacked configuration. In some instances, the first tier may refer to a read tier and the second tier refers to a write tier.

At block 620, method 600 may be configured to dispose multiple transistors in the multi-tiered memory structure with first transistors arranged in the first tier and also second transistors arranged in the second tier. In some instances, the multi-tiered memory structure may refer to a multi-tiered bitcell structure, and the first transistors and the second transistors are arranged and configured as a bitcell having the multi-tiered bitcell structure with a storage cell, write ports and read ports.

At block 630, method 600 may be configured to vertically couple the first transistors in the first tier to the second transistors in the second tier with a single interconnect. In some implementations, the single interconnect extends between the first tier and the second tier, and also, the single interconnect vertically couples one or more of the first transistors in the read tier to one or more of the second transistors in the write tier.

In some implementations, the first tier may refer to a read tier having the storage cell and the read ports, and the first transistors may be coupled to the storage cell and the read ports for reading data from a lower portion of the bitcell. Also, the second tier may refer to a write tier having the write ports, and the second transistors may be coupled to the storage cell with the single interconnect for writing data from an upper portion of the bitcell to the lower portion of the bitcell.

In some other implementations, the second tier may refer to a write tier having the storage cell and the write ports, and the second transistors may be coupled to the storage cell and the write ports for writing data to an upper portion of the bitcell. Also, the first tier may refer to a read tier having the read ports, and the first transistors may be coupled to the storage cell with the single interconnect for reading data from an upper portion of the bitcell to the lower portion of the bitcell.

FIG. 7 illustrates a process flow diagram of a method 700 for providing 3D multi-ported memory architecture in accordance with implementations described herein. In some implementations, method 700 may refer to a method for splitting memory architecture into multiple tiers, such as, e.g., three tiers in a 3D multi-tiered memory structure.

It should be understood that even though method 700 indicates a particular order of operation execution, in some cases, various portions of operations may be executed in a different order, and on different systems. In other cases, additional operations and/or steps may be added to and/or omitted from method 700. Also, method 700 may be implemented in hardware and/or software. For instance, if implemented in hardware, method 700 may be implemented with various components and/or circuitry, as described in FIGS. 1-6. Also, in other instances, if implemented in software, method 700 may be implemented as a program or software instruction process configured for providing 3D multi-ported memory architecture, as described herein. Also, in other instances, if implemented in software, instructions related to implementing method 700 may be stored in memory and/or a database. Thus, in various implementations, a computer or various other types of computing devices with a processor and memory may be configured to perform method 700.

As described in reference to FIG. 7, the method 700 may be used for fabricating and/or manufacturing, or causing to be fabricated and/or manufactured, an integrated circuit (IC) that implements various layout schemes and techniques in physical design as described herein so as to provide 3D multi-ported and/or multi-tiered memory architecture using various associated devices, components and/or circuitry as described herein.

At block 710, method 700 may be configured to split memory circuitry into a multi-tiered memory structure with multiple tiers including, e.g., a first tier, a second tier and a third tier, that are arranged vertically in a stacked configuration. The multi-tiered memory structure may refer to a multi-tiered bitcell structure.

At block 720, method 700 may be configured to dispose multiple transistors in the multi-tiered memory structure, e.g., with first transistors configured as read ports in the first tier, second transistors configured as a storage cell in the second tier, and third transistors configured as write ports in the third tier. In some instances, the first transistors, the second transistors and the third transistors may be arranged and configured as a bitcell having the multi-tiered bitcell structure with the write ports, the storage cell, and the read ports.

At block 730, method 700 may be configured to vertically couple the first transistors in the first tier to the second transistors in the second tier with a first single interconnect, and at block 740, method 700 may be configured to vertically couple the third transistors in the third tier to the second transistors in the second tier with a second single interconnect.

In some implementations, the first single interconnect may extend between the first tier and the second tier, and the second single interconnect extends between the second tier and the third tier. The first tier may refer to a read tier, the second tier may refer to a storage tier, and the third tier may refer to a write tier. The first single interconnect may be configured to vertically couple one or more of the first transistors in the read tier to one or more of the second transistors in the storage tier. Also, the second single interconnect vertically may be configured to couple one or more of the third transistors in the write tier to one or more of the second transistors in the storage tier.

In some implementations, the first tier may refer to a read tier with first transistors configured as the read ports, and also, the second tier may refer to a storage tier with second transistors configured as the storage cell. In addition, the first transistors may be configured to couple the read ports in the first tier to the storage cell in the second tier with the first single interconnect so as to read data from a middle portion of the bitcell to a lower portion of the bitcell. Moreover, in some implementations, the second tier may refer to a storage tier having the second transistors configured as the storage cell, and the third tier may refer to a write tier having the third transistors configured as the write ports. In addition, the third transistors may be configured to couple the write ports in the third tier to the storage cell in the second tier with the second single interconnect so as to write data from an upper portion of the bitcell to the middle portion of the bitcell.

It should be intended that the subject matter of the claims not be limited to various implementations and/or illustrations provided herein, but should include any modified forms of those implementations including portions of implementations and combinations of various elements in reference to different implementations in accordance with the claims. It should also be appreciated that in development of any such implementation, as in any engineering or design project, numerous implementation-specific decisions should be made to achieve developers' specific goals, such as, e.g., compliance with system-related constraints and/or business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device having a multi-tiered memory structure with a first tier and a second tier that are arranged vertically in a stacked configuration. The device may include multiple transistors disposed in the multi-tiered memory structure with first transistors disposed in the first tier and second transistors disposed in the second tier. The device may include a single interconnect that vertically couples the first transistors in the first tier to the second transistors in the second tier.

Described herein are various implementations of a method. The method may split memory circuitry into a multi-tiered memory structure having a first tier and a second tier arranged vertically in a stacked configuration. The method may dispose multiple transistors in the multi-tiered memory structure with first transistors arranged in the first tier and second transistors arranged in the second tier. The method may vertically couple the first transistors in the first tier to the second transistors in the second tier with a single interconnect.

Described herein are various implementations of a method. The method may split memory circuitry into a multi-tiered memory structure with a first tier, a second tier and a third tier arranged vertically in a stacked configuration. The method may dispose multiple transistors in the multi-tiered memory structure with first transistors configured as read ports in the first tier, second transistors configured as a storage cell in the second tier, and third transistors configured as write ports in the third tier. The method may vertically couple the first transistors in the first tier to the second transistors in the second tier with a first single interconnect. The method may vertically couple the third transistors in the third tier to the second transistors in the second tier with a second single interconnect.

Reference has been made in detail to various implementations, examples of which are illustrated in accompanying drawings and figures. In the following detailed description, numerous specific details are set forth to provide a thorough understanding of the disclosure provided herein. However, the disclosure provided herein may be practiced without these specific details. In various implementations, well-known methods, procedures, components, circuits and networks have not been described in detail so as not to unnecessarily obscure details of the embodiments.

It should also be understood that, although various terms first, second, etc. may be used herein to describe various elements, these elements should not be limited by these terms. These terms are only used to distinguish one element from another. For instance, a first element could be termed a second element, and, similarly, a second element could be termed a first element. Also, the first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The terms "up" and "down"; "upper" and "lower"; "upwardly" and "downwardly"; "below" and "above"; and various other similar terms that indicate relative positions above or below a given point or element may be used in connection with various implementations of various technologies described herein.

While the foregoing is directed to implementations of various techniques described herein, other and further implementations may be devised in accordance with the disclosure herein, which may be determined by the claims that follow. Although the subject matter has been described in language specific to structural features and/or methodological acts, it is to be understood that the subject matter defined in the appended claims is not necessarily limited to the specific features or acts described above. Rather, specific features and/or acts described above are disclosed as example forms of implementing the claims.

What is claimed is:

1. A device, comprising:
    a multi-tiered memory structure with a first tier and a second tier arranged vertically in a stacked configuration;
    multiple transistors disposed in the multi-tiered memory structure with first transistors disposed in the first tier and second transistors disposed in the second tier;
        wherein the first transistors are coupled to at least one wordline and at least one bitline for reading and writing data;
        wherein the second transistors are coupled to a read wordline and a read bitline for reading data; and
    a single interconnect that vertically couples the first transistors in the first tier to the second transistors in the second tier.

2. The device of claim 1, wherein the device comprises a static random access memory (SRAM) device arranged in a three-dimensional (3D) stacked configuration.

3. The device of claim 1, wherein:
    the single interconnect extends between the first tier and the second tier,
    the first tier refers to a read-write tier and the second tier refers to a read tier, and
    the single interconnect vertically couples one or more of the first transistors in the read-write tier to a gate of at least one of the second transistors in the read tier.

4. The device of claim 1, wherein:
    the multi-tiered memory structure refers to a multi-tiered bitcell structure, and
    the first transistors and the second transistors are arranged and configured as a bitcell having the multi-tiered bitcell structure.

5. The device of claim 4, wherein:
    the first tier refers to a read-write tier,
    the first transistors are arranged in a lower portion of the bitcell, and
    the first transistors are coupled to the at least one wordline and the at least one bitline for reading and writing data to the bitcell.

6. The device of claim 5, wherein:
    the bitcell refers to an eight-transistor (8T) bitcell having one read port (1R) and one read-write port (1RW), and
    the first transistors refer to six transistors in the read-write tier of the 8T bitcell.

7. The device of claim 5, wherein:
    the bitcell refers to a ten-transistor (10T) bitcell having two read ports (2R) and one read-write port (1RW), and
    the first transistors refer to six transistors in the read-write tier of the 10T bitcell.

8. The device of claim 4, wherein:
    the second tier refers to a read tier,
    the second transistors are arranged in an upper portion of the bitcell, and
    the second transistors are coupled to the read wordline and the read bitline for reading data from the bitcell.

9. The device of claim 8, wherein:
    the bitcell refers to an eight-transistor (8T) bitcell having one read port (1R) and one read-write port (1RW), and
    the second transistors refer to two transistors in the read tier of the 8T bitcell.

10. The device of claim 8, wherein:
    the bitcell refers to a ten-transistor (10T) bitcell having two read ports (2R) and one read-write port (1RW), and
    the second transistors refer to four transistors in the read tier of the 10T bitcell.

11. A method, comprising:
    splitting memory circuitry into a multi-tiered memory structure having a first tier and a second tier arranged vertically in a stacked configuration;
    disposing multiple transistors in the multi-tiered memory structure with first transistors arranged in the first tier and second transistors arranged in the second tier;
        the first transistors being coupled to at least one wordline and at least one bitline for reading and writing data;
        the second transistors being coupled to a read wordline and a read bitline for reading data; and
    vertically coupling the first transistors in the first tier to the second transistors in the second tier with a single interconnect.

12. The method of claim 11, wherein:
    the single interconnect extends between the first tier and the second tier,
    the first tier refers to a read tier and the second tier refers to a write tier, and
    the single interconnect vertically couples one or more of the first transistors in the read tier to one or more of the second transistors in the write tier.

13. The method of claim 11, wherein:
    the multi-tiered memory structure refers to a multi-tiered bitcell structure, and
    the first transistors and the second transistors are arranged and configured as a bitcell having the multi-tiered bitcell structure with a storage cell, write ports and read ports.

14. The method of claim 13, wherein:
    the first tier refers to a read tier having the storage cell and the read ports,
    the first transistors are coupled to the storage cell and the read ports for reading data from a lower portion of the bitcell,
    the second tier refers to a write tier having the write ports, and
    the second transistors are coupled to the storage cell with the single interconnect for writing data from an upper portion of the bitcell to the lower portion of the bitcell.

15. The method of claim 13, wherein:
    the second tier refers to a write tier having the storage cell and the write ports,
    the second transistors are coupled to the storage cell and the write ports for writing data to an upper portion of the bitcell,
    the first tier refers to a read tier having the read ports, and
    the first transistors are coupled to the storage cell with the single interconnect for reading data from an upper portion of the bitcell to the lower portion of the bitcell.

16. A method, comprising:
splitting memory circuitry into a multi-tiered memory structure with a first tier, a second tier and a third tier arranged vertically in a stacked configuration;
disposing multiple transistors in the multi-tiered memory structure with first transistors configured as read ports in the first tier, second transistors configured as a storage cell in the second tier, and third transistors configured as write ports in the third tier;
vertically coupling the first transistors in the first tier to the second transistors in the second tier with a first single interconnect, and
vertically coupling the third transistors in the third tier to the second transistors in the second tier with a second single interconnect.

17. The method of claim 16, wherein:
the first single interconnect extends between the first tier and the second tier,
the second single interconnect extends between the second tier and the third tier,
the first tier refers to a read tier, the second tier refers to a storage tier, and the third tier refers to a write tier,
the first single interconnect vertically couples one or more of the first transistors in the read tier to one or more of the second transistors in the storage tier, and
the second single interconnect vertically couples one or more of the third transistors in the write tier to one or more of the second transistors in the storage tier.

18. The method of claim 16, wherein:
the multi-tiered memory structure refers to a multi-tiered bitcell structure, and
the first transistors, the second transistors and the third transistors are arranged and configured as a bitcell having the multi-tiered bitcell structure with the read ports, the storage cell, and the write ports.

19. The method of claim 18, wherein:
the first tier refers to a read tier having the first transistors configured as the read ports,
the second tier refers to a storage tier having the second transistors configured as the storage cell, and
the first transistors are configured to couple the read ports in the first tier to the storage cell in the second tier with the first single interconnect so as to read data from a middle portion of the bitcell to a lower portion of the bitcell.

20. The method of claim 18, wherein:
the second tier refers to a storage tier having the second transistors configured as the storage cell,
the third tier refers to a write tier having the third transistors configured as the write ports, and
the third transistors are configured to couple the write ports in the third tier to the storage cell in the second tier with the second single interconnect so as to write data from an upper portion of the bitcell to the middle portion of the bitcell.

* * * * *